United States Patent
Inoue

(10) Patent No.: US 7,151,401 B2
(45) Date of Patent: Dec. 19, 2006

(54) SEMICONDUCTOR APPARATUS

(75) Inventor: Takahiro Inoue, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 10/791,825

(22) Filed: Mar. 4, 2004

(65) Prior Publication Data
US 2005/0017788 A1    Jan. 27, 2005

(30) Foreign Application Priority Data
Jul. 23, 2003    (JP) ............................. 2003-278228

(51) Int. Cl.
    *H03K 17/687*    (2006.01)
(52) U.S. Cl. .................... 327/434; 327/427; 327/108
(58) Field of Classification Search ................ 327/427, 327/429, 432–434, 108, 376, 377; 326/82–84, 326/89
See application file for complete search history.

(56) References Cited

U.S. PATENT DOCUMENTS

| | | | |
|---|---|---|---|
| 5,089,719 A | | 2/1992 | Kamei et al. |
| 6,333,665 B1* | | 12/2001 | Ichikawa ................ 327/434 |
| 6,720,819 B1* | | 4/2004 | Yamamoto ............... 327/427 |
| 6,756,826 B1* | | 6/2004 | Klein et al. ............... 327/108 |

FOREIGN PATENT DOCUMENTS

| | | |
|---|---|---|
| JP | 3-117211 | 5/1991 |
| JP | 4-278714 | 10/1992 |
| JP | 5-235722 | 9/1993 |
| JP | 5-328746 | 12/1993 |
| JP | 10-32976 | 2/1998 |
| JP | 10-150764 | 6/1998 |
| JP | 2001-037207 | 2/2001 |
| JP | 2001-223571 | 8/2001 |

* cited by examiner

*Primary Examiner*—Long Nguyen
(74) *Attorney, Agent, or Firm*—Oblon, Spivak, McClelland, Maier & Neustadt, P.C.

(57) ABSTRACT

Disclosed is a semiconductor apparatus having an IGBT, which includes a switch SWon 1 for supplying a gate current during an operation for turning on the gate of the IGBT, a switch SWoff 1 for discharging a gate capacitance during an operation for turning off the gate, a switch SWon 2 for increasing the gate current, a timer 14 for turning on the switch SWon 2 in conjunction with the turn-on of the switch SWon 1 and then maintaining the turn-on of the switch SWon 2 only for a first predetermined time, a switch SWoff 2 for increasing the discharge current during the gate turn-off operation, and a timer 15 for turning on the switch SWoff 2 in conjunction with the turn-on of the switch SWoff 1 and then maintaining the turn-on of the switch SWoff 2 only for a second predetermined time.

8 Claims, 3 Drawing Sheets

SEMICONDUCTOR APPARATUS

BACKGROUND OF THE INVENTION

The present invention relates to a semiconductor apparatus using an MOS-type device, designed to control a time-period between the receiving of an external signal and the actual action of the device itself so as to achieve improvement in response and efficiency, and reduction in EMI noise and switching loss.

In a semiconductor apparatus having a tail-end circuit with a MOS-type device to be driven by an external signal, the MOS-type device has a relatively large delay time between the receiving of the external signal intended to turn off the device and the establishment of its actual OFF state. This delay time is caused by a capacitance around the gate of the device. Heretofore, in a circuit for switching the gate, a resistor inserted in series to the gate has been preset at a certain value to adequately control the charge and discharge of the gate. That is, the rise and fall times of a gate voltage have been adjusted in accordance with a CR time constant determined by a gate capacitance C and a gate resistance R.

The respective timings of allowing current to start passing through the device and allowing the current to be cut off are dependent on a threshold voltage specific to the device. In particular, the turn-off action of the device is related to a switching speed specific to the device. Thus, the technique of controlling the gate charging and discharging times of the device only by a gate resistor set at a certain fixed value results in creation of another delay time in addition to the delay time due to the threshold voltage of the device, which leads to deterioration in efficiency.

Further, if the charge and discharge of the gate is conducted using a gate resistor set at a fixed value, a switching speed during the turn-on of the device will become faster in a low current range than that in a rated current range. The resulting increased value dV/dt during the turn-on of a free-wheel diode (FWDi) connected in parallel to the device serves as a factor of causing the degradation in EMI noise. Otherwise, if the switching speed during the turn-on is lowered to reduce EMI noise, a switching loss will be increased.

As above, there is a trade-off relationship between EMI noise and switching loss. For this reason, the gate resistor has heretofore been preset at a certain value selected based on a compromise point compatible with both EMI noise and switching loss.

In order to allowing the gate of a device to be driven at low loss and low noise, there has been known a technique in which a plurality of MOSFETs each having a different turn-on resistance are used as switches for driving the gate of an IGBT, and these switches are sequentially combined such that the entire turn-on resistance is transitionally changed to vary a gate drive performance [see, for example, Japanese Patent Laid-Open Publication No. 2001-223571, "Gate Drive Circuit for Voltage Driven-type Semiconductor Device" (Paragraph [0005], FIG. 2), hereinafter referred to as Patent Publication 1].

There has also been known a technique for noise reduction in which the value di/dt in a detected IGBT collector current is compared with a command value through a comparator, and a switch is turned on and off in accordance with the comparison result to instantaneously change a gate resistance [see, for example, Japanese Patent Laid-Open Publication No. 10-150764, "Gate Drive Circuit for use in Power Converter" (Paragraph [0008], FIG. 6), hereinafter referred to as Patent Publication 2].

The circuit disclosed in Patent Publication 1 is a type of controlling a gate voltage. Further, the circuit involves a number of switches and a complicate control for sequentially turning on the switches depending on the characteristics of the IGBT.

In the circuit disclosed in Patent Publication 2, if the gate resistance is sharply changed during a turn-on operation where a collector current flows at a value approximately equal to a comparison reference value of the comparator, the operation of the IGBT is likely to become unstable to cause oscillation in an output current therefrom.

SUMMARY OF THE INVENTION

In view of the above circumstances, it is an object of the present invention to provide a semiconductor apparatus capable of stably operating a MOS-type device using a relatively simple configuration while facilitating improvement in response and efficiency, and reduction in EMI noise and switching loss.

In order to achieve the above object, the present invention provides a semiconductor apparatus including a MOS-type device such as an IGBT, comprising a first switch for supplying a gate current during a gate turn-on operation for turning on the gate of the MOS-type device, and a second switch for discharging a gate capacitance during a gate turn-off operation for turning off the gate of the MOS-type device. The semiconductor apparatus further includes a third switch for increasing the gate current during the gate turn-on operation, first timer means for turning on the third switch in conjunction with the turn-on of the first switch and then turning off the third switch after a first predetermined time from the turn-on of the third switch, a fourth switch for increasing the discharge current during the gate turn-off operation, and second timer means for turning on the fourth switch in conjunction with the turn-on of the second switch and then turning off the fourth switch after a second predetermined time from the turn-on of the fourth switch.

According to the present invention, in the gate turn-on operation, the gate current is increased only for the first predetermined time by turning on the first switch and turning on the third switch for the first predetermined time. Thus, the time-period allowing the gate to be turned on can be reduced. In the gate turn-off operation, the discharge current from the gate is increased only for the second predetermined time by turning on the second switch and turning on the fourth switch for the second predetermined time. Thus, the time-period allowing the gate to be turned off can be reduced. The semiconductor apparatus constructed as above can achieve reduction in switching loss and delay time.

Other features and advantages of the present invention will be apparent from the accompanying drawings and from the detailed description.

DETAILED DESCRIPTION OF THE PREFERRED EMBODIMENTS

With reference to the drawings, an embodiment of the present invention will now be described.

[First Embodiment]

Figure 1:
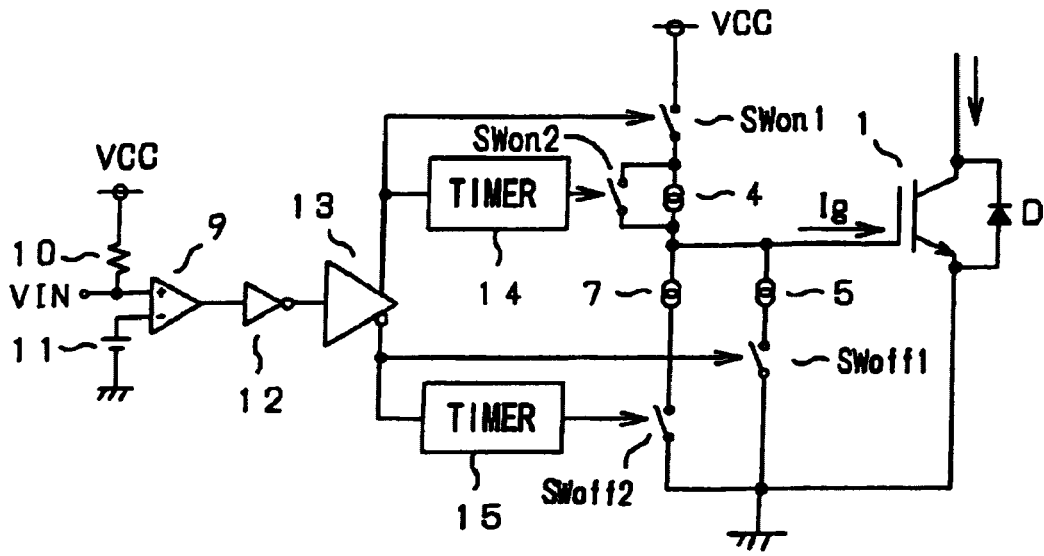
FIG. 1 is a schematic circuit diagram of a semiconductor apparatus according to a first embodiment of the present invention.

FIG. 1 shows a MOS-type power device and a drive system thereof in a tail-end circuit of a semiconductor apparatus according to a first embodiment of the present invention. For turning on the gate a power device (e.g. IGBT) 1 associated with a freewheel diode D, two switches SWon 1, SWon 2 (or first and third switches) each composed of a transistor are inserted in series between a power supply VCC and the gate of the power device 1. A constant current device 4 is connected in parallel with the switch SWon 2.

For turning off the gate of the power device 1, a switch SWoff 1 (or second switch) composed of a transistor is connected between the gate and emitter of the power device 1 through a constant current device 5, and a switch SWoff 2 (or fourth switch) composed of a transistor is connected between the gate and emitter of the power device 1 through a constant current device 7.

An input signal VIN is entered into a positive input terminal of a comparator 9 which is connected with a pull-up resistor 10. A reference voltage source 11 is connected to a negative input terminal of the comparator 9. An output signal of the comparator 9 is supplied to an input terminal of an amplifier 13 through an inverter 12. A noninverted output of the amplifier 13 as a turn-on signal is supplied to the switch SWon 1 and concurrently entered into a timer 14. In response to the input of the turn-on signal, the timer 14 (serving as first timer means) is operable to turn on the switch SWon 2. After 100 ns from the turn-on of the switch SWon 2, the timer 14 is operable to turn off the switch SWon 2.

An inverted output of the amplifier 13 as a turn-off signal is supplied to the switch SWoff 1 and concurrently entered into a timer 15. In response to the input of the turn-off signal, the timer 15 (serving as second timer means) is operable to turn on the switch SWoff 2. After 200 ns from the turn-on of the switch SWoff 2, the timer 15 is operable to turn off the switch SWoff 2.

Figure 2:
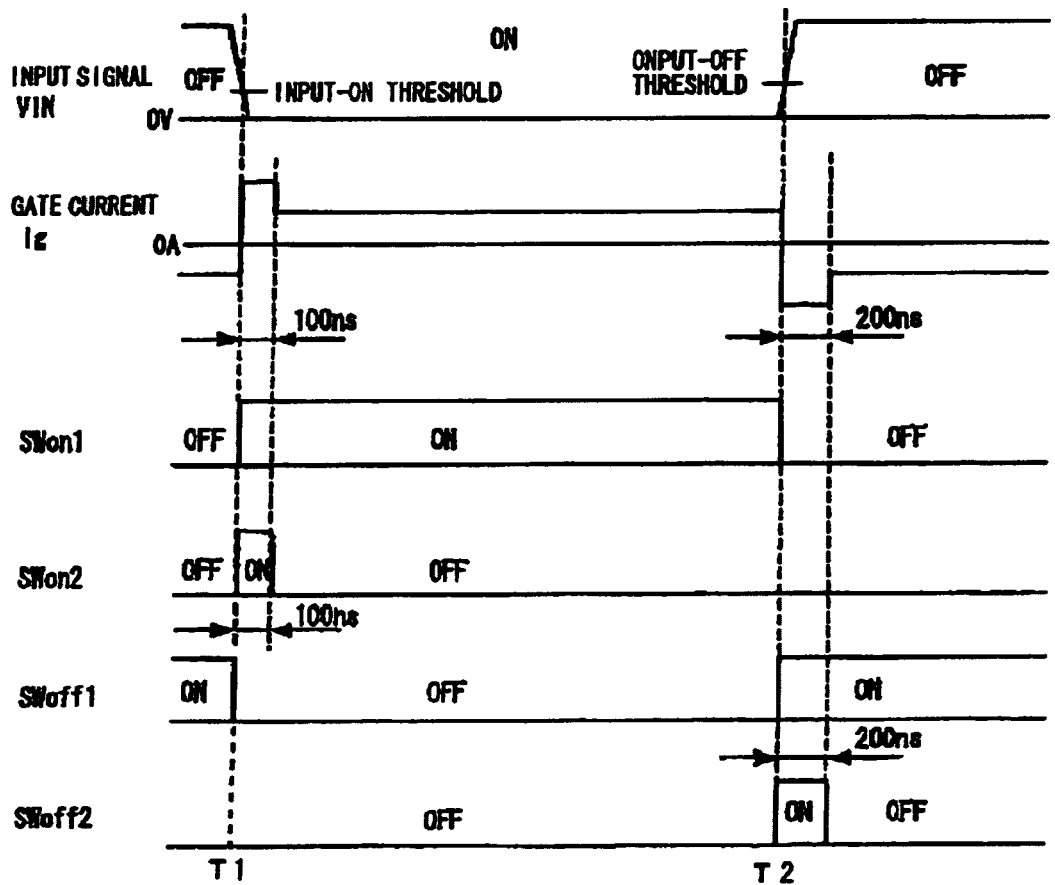
FIG. 2 is an operational time chart of the circuit in FIG. 1.

The operation of the above circuit will be described with reference to the time chart in FIG. 2. During the course that the input signal VIN from outside changes from an OFF signal (a signal for turning off the IGBT 1) of High Level to an ON signal (a signal for turning on the IGBT 1) of Low Level, upon falling to an input-ON threshold (1.5 V in FIG. 2) (at Time T1), the switch SWon 1 is turned on, and simultaneously the switch SWon 2 is turned on through the timer 14. At Time T1, the switch SWoff 1 is changed from ON state to OFF state (as can be understood from the later description, when the input signal VIN is in OFF state, the switch SWoff 1 is in ON state), and the switch SWoff 2 remains in OFF state.

Thus, a gate current Ig is supplied through the switch SWon 1 and the switch SWon 2 which are turned on at Time T1, so that a gate charge is initiated. In this process, a large amount of gate current Ig supplied from both the switches SWon 1, SWon 2 in ON state provides a shortened time-period required for a gate voltage to rise to a gate-ON threshold to allow the IGBT 1 to be turned on in a short time-period after the turn-on of the switches SWon 1, SWon 2 (Time T1).

After 100 ns from the turn-on of the switches SWon 1, SWon 2 (Time T1), only the switch SWon 2 is turned off. While the gate current Ig is thereby reduced by about half, the remaining gate current is sufficient to keep the IGBT 1 in ON state. This time-period of 100 ns is set to be slightly longer than a delay time between the turn-on of the switches SWon 1, SWon 2 and the switching of the IGBT 1 to ON state.

Subsequently, during the course that the input signal VIN changes from the ON signal of Low Level to the OFF signal of High Level, upon rising to an input-OFF threshold (2.0 V in this embodiment) (at Time T2), the switch SWon 1 is turned off (the switch SWon 2 remains in OFF state). At Time T2, the switch SWoff 1 is turned on, and the switch SWoff 2 is simultaneously turned on through and the timer 15.

Upon separated from the power supply Vcc, the gate is connected to the emitter through the switches SWoff 1, SWon 2, so that a gate discharge (negative current in FIG. 2) is initiated. In this process, a large discharge current flowing through both the switches SWoff 1, SWoff 2 in ON state provides a shortened time-period required for the gate voltage to fall to a gate-OFF threshold to allow the IGBT 1 to be turned off in a short time-period after the turn-on of the switches SWoff 1, SWoff 2 (Time T2).

After 200 ns from the turn-on of the switches SWoff 1, SWoff 2 (Time T2), only the switch SWoff 2 is turned off. While the gate discharge current is thereby reduced by about half, the remaining gate discharge current is sufficient to keep the IGBT 1 in OFF state. This time-period of 200 ns is set to be slightly longer than a delay time between the turn-on of the switches SWoff 1, SWoff 2 and the switching of the IGBT 1 to OFF state.

In this way, the gate charge and discharge currents to the IGBT 1 can be varied so as to reduce the time-period between the receiving of the external input signal and the complete of the operation of the device to provide enhanced efficiency. In addition, the switching time-period (delay time) can be shortened to provide reduced switching loss.

While the switches SWon 1 and SWon 2 in FIG. 1 are connected in series with one another, they may be are a connected in parallel with one another in such a manner that the gate current Ig is increased by turning on the switch SWon 2.

[Second Embodiment]

Figure 3:
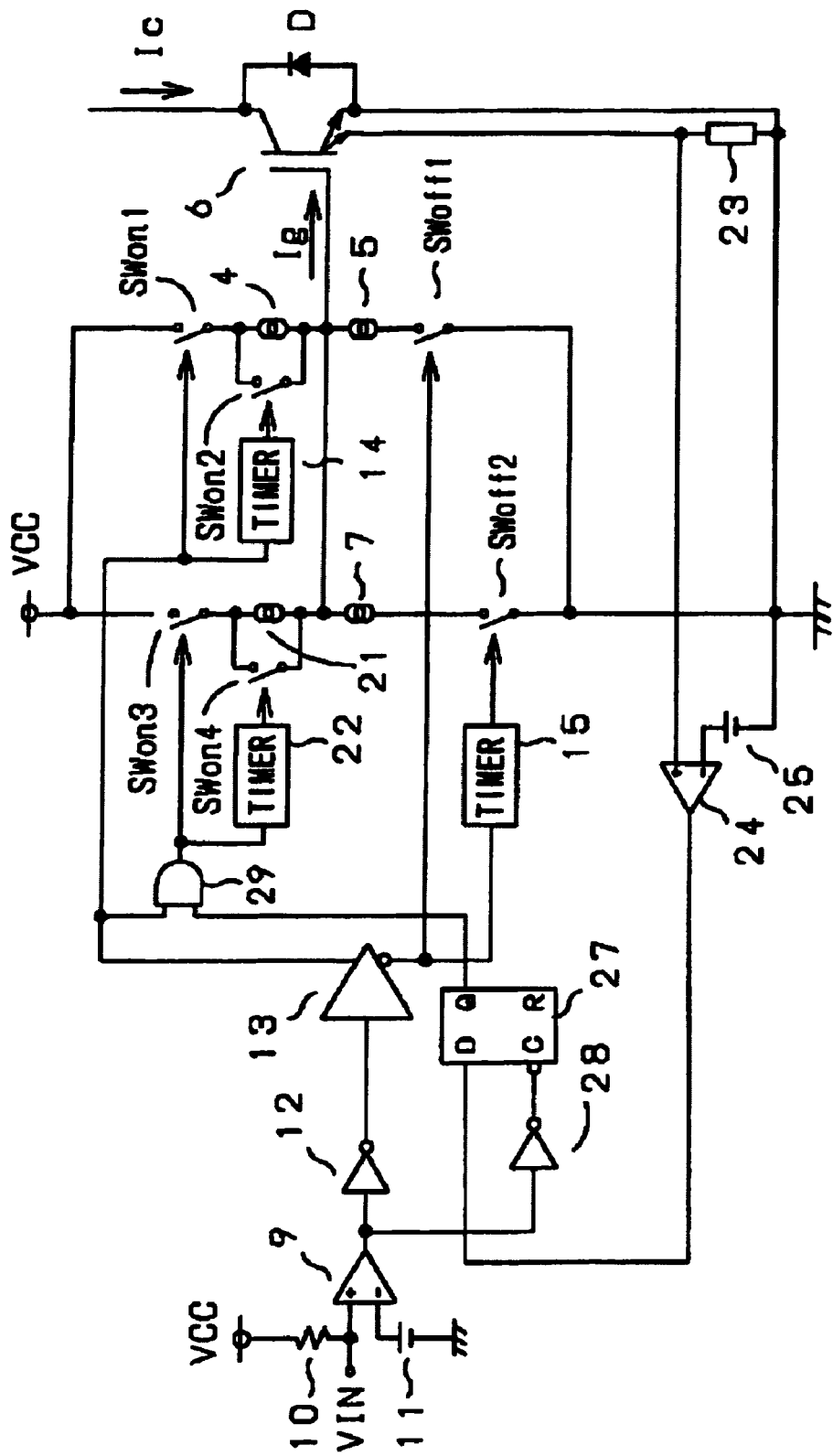
FIG. 3 is a schematic circuit diagram of a semiconductor apparatus according to a second embodiment of the present invention.

A second embodiment of the present invention is configured such that in accordance with the amount of the current flowing through an IGBT turned on according to a first turn-on operation, a gate charge current in a second turn-on operation subsequent to the first turn-on operation is varied to change a switching speed during turn-on of the gate. FIG. 3 shows a tail-end circuit of a semiconductor apparatus according to the second embodiment.

In the circuit of FIG. 3, the same component or element as that in FIG. 1 is defined by the same reference numeral or code. As shown in FIG. 3, in addition to a turn-on circuit comprised of a switch SWon 1, a switch SWon 2, a constant current device 4 and a timer 14, the circuit additionally includes a switch SWon 3, a switch SWon 4, a constant current device 21 and a timer 22, as a second turn-on circuit. The following circuits are added in order to control this 2nd turn-on circuit.

An IGBT 6 has a second emitter for detecting a collector current Ic. A voltage generated at a resistor 23 inserted in series to the second emitter circuit is entered into a positive input terminal of a comparator 24. A reference voltage source 25 is connected to a negative input terminal of the comparator 24, and an output of the comparator 24 is entered into a D terminal of a latch circuit 27. Then, the output of the aforementioned comparator 9 as a carry signal is entered into a C terminal of the latch circuit 27 through an inverter 28, and concurrently entered into a C terminal of the latch circuit 27 through an inverter 28.

An output from a Q terminal of the latch circuit 27 is supplied to one of a pair of input terminals of an AND gate 29, and the noninverted output of the aforementioned amplifier 13 is entered into the other input terminal of the AND gate 29. Then, an output of the AND gate 29 as a drive signal is supplied to the switch SWon 3 and the timer 22.

Figure 4:
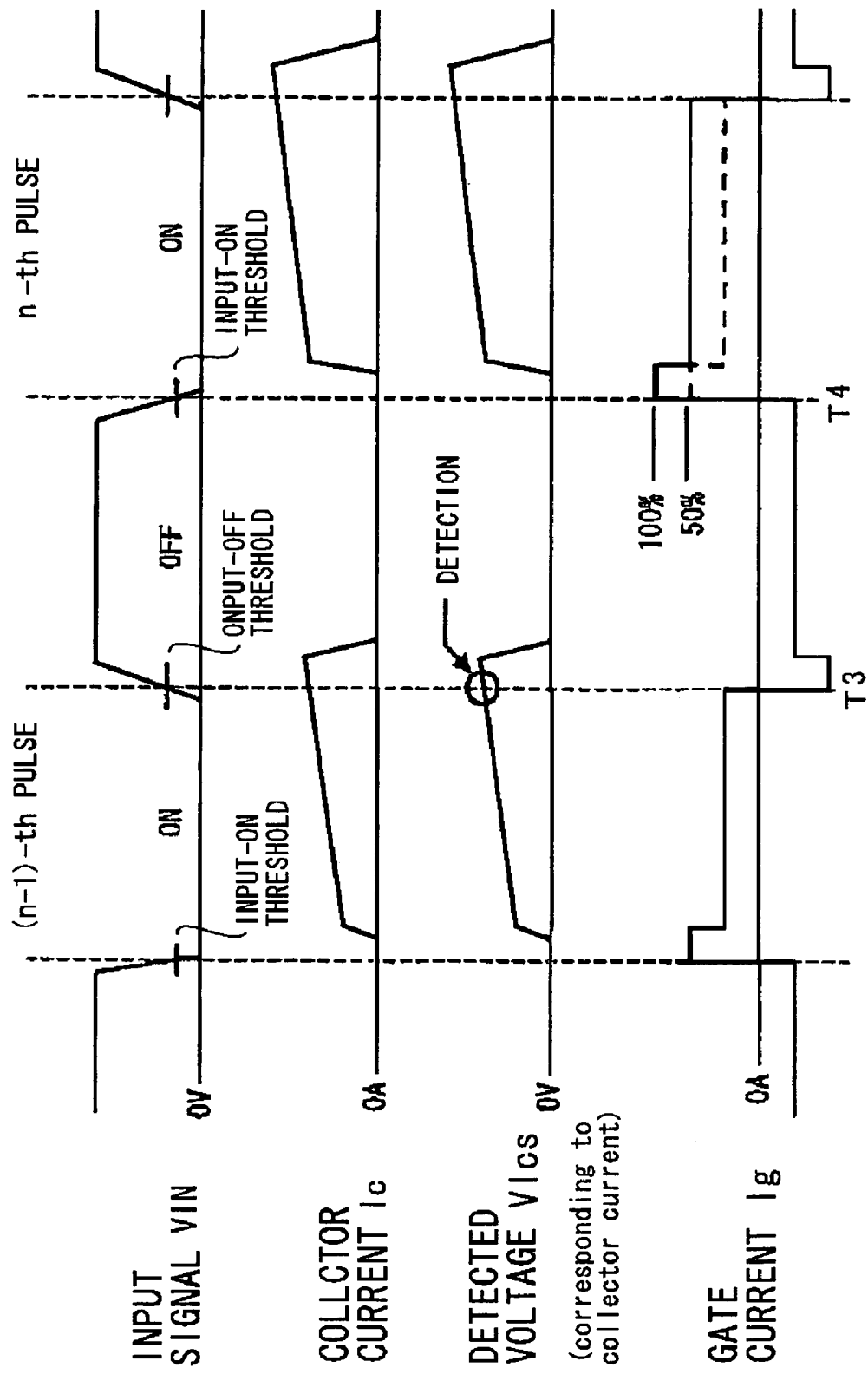
FIG. 4 is an operational time chart of the circuit in FIG. 3.

The operation of the above circuit will be described with reference to the time chart in FIG. 4. The comparator 24 determines whether the collector current Ic flowing through the IGBT 1 turned on when an input signal VIN of a (n−1)-th pulse is an ON signal of Low Level is greater than one-half of a rated current, and then supplies the determination result to the latch circuit 27.

During the course that the (n−1)-th pulse input signal VIN changes from the ON signal of Low Level to an OFF signal (a signal for turning off the IGBT 6) of High Level, upon rising beyond an input-OFF threshold (at Time T3), the comparator 9 outputs the High Level signal. In response to this signal, the signal supplied to the latch circuit 27 (judgment result) is latched by the latch circuit 27 and that signal is outputted from a Q terminal of the latch circuit 27.

Subsequently, during the course that input signal VIN changes from the OFF signal of High Level to the ON signal of Low Level, upon falling beyond an input-ON threshold and shifting from the (n−1)-th pulse to an n-th pulse (at Time T4), the switches SWon 1, SWon 2 are turned on. In this process, if the collector current Ic is equal to or greater than 50% of the rated current at Time T3, the High Level signal will be supplied from the latch circuit 27 to the AND gate 29 to allow the switches SWon 3, SWon 4 to be turned on.

When all of the switches SWon 1 to SWon 4 are turned on in this way, a gate current Ig is increased up to 100% of a predetermined value, and the IGBT 6 is switched to ON state according to the gate current Ig. After 100 ns from Time T4, the switches SWon 2, SWon 4 are turned off by the timers 14, 22, and thereby the gate current Ig is reduced to 50% of the predetermined value.

Otherwise, if the collector current Ic is less than 50% of the rated current at Time T3, the AND gate 29 keeps outputting the Low Level signal. Thus, only the switches SWon 1, SWon 2 are in ON state, and thereby the gate current Ig is set at 50% of the predetermined value. The operation in this case is the same as that in FIG. 1.

As above, in the high current (50% or more of the rated current) operation of the IGBT 6, the gate current Ig is increased to provide a higher switching speed. Thus, as compared to the conventional semiconductor apparatus using a gate resistor set at a fixed value, a switching loss can be reduced. In the low current (less than 50% of the rated current) operation of the IGBT 6, the gate current Ig is reduced to provide a lower switching speed. Thus, the value dV/dt during turning off the freewheel diode D is reduced to allow EMI noise to be effectively reduced.

Further, when the high current operation of the IGBT 6 is detected, the gate current Ig is not immediately increased, but in a subsequent operation for turning on the IGBT 6. Thus, the risk of the unstable operation of the IGBT and oscillation of output current as in Patent Publication 2 can be eliminated.

Advantageous embodiments of the invention have been shown and described. It is obvious to those skilled in the art that various changes and modifications may be made therein without departing from the spirit and scope thereof as set forth in appended claims.

What is claimed is:

1. A semiconductor apparatus including a MOS-type device, comprising:
    a first switch configured to supply a gate current during a first turn-on operation for turning on said MOS-type device;
    a second switch configured to discharge a gate capacitance by a discharge current during a turn-off operation for turning off said MOS-type device;
    a third switch configured to increase said gate current;
    first timer configured to turn on said third switch in conjunction with the turn-on of said first switch, and then configured to turn off said third switch after a first predetermined time from said turn-on of said third switch;
    a fourth switch configured to increase the discharge current during said turn-off operation; and
    second timer configured to turn on said fourth switch in conjunction with the turn-on of said second switch, and then configured to turn off said fourth switch after a second predetermined time from said turn-on of said fourth switch,
    wherein said first and third switches are connected in series.

2. The semiconductor apparatus as defined in claim 1, wherein the first and third switches form a first gate turn-on circuit, the semiconductor apparatus further comprising:
    a second gate turn-on circuit connected in parallel with said first gate turn-on circuit and configured to perform a second turn-on operation for turning on said MOS-type device; and
    means for detecting a collector current of said MOS-type device,
    wherein when said detected collector current is less than a predetermined value, only said first gate turn-on circuit is activated to provide the gate current at a first amount, and
    when said detected collector current is equal to or greater than said predetermined value, both said first and second gate turn-on circuits are activated to provide the gate current at a second amount greater than said first amount.

3. The semiconductor apparatus as defined in claim 2, wherein when the detected collector current of said MOS-type device which is turned on after the first turn-on operation is equal to or greater than said predetermined value, said second gate turn-on circuit is activated to perform the second turn-on operation subsequent to said first turn-on operation.

4. The semiconductor apparatus as defined in claim 1, wherein said first predetermined time is set at a value configured to allow said MOS-type device to be turned on after said first and third switches are turned on, and said second predetermined time is set at a value configured to allow said MOS-type device to be turned off after said second and fourth switches are turned on.

5. The semiconductor apparatus as defined in claim 1, wherein said third switch is connected in parallel to a first constant current device.

6. The semiconductor apparatus as defined in claim 1, wherein said second switch is connected in series to a second constant current device and said fourth switch is connected in series to a third constant current device, and the second switch with the second constant current device is connected in parallel to the fourth switch with the third constant current device.

7. The semiconductor apparatus as defined in claim 1, wherein the second switch is connected between the gate and an emitter of the MOS-type device through a second constant current device, and the fourth switch is connected between the gate and the emitter of the MOS-type device through a third constant current device.

8. The semiconductor apparatus as defined in claim 2, wherein said first and second gate turn-on circuits are connected between a power supply voltage and the gate of said MOS-type device.

* * * * *